US008802565B2

(12) United States Patent
Hartig et al.

(10) Patent No.: US 8,802,565 B2
(45) Date of Patent: Aug. 12, 2014

(54) SEMICONDUCTOR PLURAL GATE LENGTHS

(75) Inventors: Michael J. Hartig, Niskayuna, NY (US); Sivananda K. Kanakasabapathy, Niskayuna, NY (US); Soon-Cheon Seo, Glenmont, NY (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/608,211

(22) Filed: Sep. 10, 2012

(65) Prior Publication Data
US 2014/0070414 A1    Mar. 13, 2014

(51) Int. Cl.
*H01L 21/302* (2006.01)
(52) U.S. Cl.
USPC .......... 438/669; 438/176; 257/E21.159; 257/E29.154
(58) Field of Classification Search
CPC ............................................ H01L 28/88–28/92
See application file for complete search history.

(56) References Cited

U.S. PATENT DOCUMENTS

| 5,147,826 A | 9/1992 | Liu et al. |
| 5,624,873 A | 4/1997 | Fonash et al. |
| 6,017,819 A | 1/2000 | Brigham et al. |
| 6,344,380 B1 | 2/2002 | Kim et al. |
| 6,682,992 B2 | 1/2004 | Geiss et al. |
| 6,884,672 B1 | 4/2005 | Belasubrmanyam et al. |
| 7,441,211 B1 | 10/2008 | Gupta et al. |
| 7,662,718 B2 | 2/2010 | Abatchev et al. |
| 7,777,302 B2 | 8/2010 | Geiss et al. |
| 7,842,559 B2 | 11/2010 | Jakschik et al. |
| 2009/0166629 A1* | 7/2009 | Mehrad et al. ................. 257/57 |
| 2011/0042740 A1 | 2/2011 | Masuoka et al. |
| 2012/0086084 A1* | 4/2012 | Kikuchi ......................... 257/369 |

OTHER PUBLICATIONS

P. Gupta et al., "Selective gate-length biasing for cost-effective runtime leakage control," Proceedings of the 41st Annual Design Automation Conference, DAC '04, 2004, 4 pages.
W. C. Natzie et al., "Trimming of hard-masks by gaseous Chemical Oxide Removal (COR) for sub-10 nm gates/fins, for gate length control and for embedded logic," IEEE Conference and Workshop, Advanced Semiconductor Manufacturing, ASMC '04. May 4-6, 2004, pp. 61-65.

* cited by examiner

*Primary Examiner* — Mamadou Diallo
(74) *Attorney, Agent, or Firm* — Yuanmin Cai; Roberts Mlotkowski Safran & Cole, P.C.

(57) ABSTRACT

Gate structures with different gate lengths and methods of manufacture are disclosed. The method includes forming a first gate structure with a first critical dimension, using a pattern of a mask. The method further includes forming a second gate structure with a second critical dimension, different than the first critical dimension of the first gate structure, using the pattern of the mask.

18 Claims, 4 Drawing Sheets

SEMICONDUCTOR PLURAL GATE LENGTHS

FIELD OF THE INVENTION

The invention relates to semiconductor structures and methods of manufacture and, more particularly, to gate structures with different gate lengths and methods of manufacture.

BACKGROUND

Semiconductor manufacturing is a complex process, from design to fabrication. For example, in order to manufacture a semiconductor device, many processes must be performed in order to obtain a desired design (pattern or structure) on the wafer. These processes range from initial design of the circuit or other structure, to the deposition of material, lithography and etching processes which form the circuit or other structure.

Lithography processes, for example, include the use of optical masks in order to print patterns on a wafer. These patterns define the structure of and interconnection between the different components and features of the integrated circuit. The mask includes, for example, patterns of different shapes, which can be transferred to an entire wafer in a single exposure.

SUMMARY

In a first aspect of the invention, a method comprises forming a first gate structure with a first critical dimension, using a pattern of a mask. The method further comprises forming a second gate structure with a second critical dimension, different than the first critical dimension of the first gate structure, using the pattern of the mask.

In another aspect of the invention, a method comprises forming amorphous silicon on a substrate. The method further comprises converting an unmasked portion of the amorphous silicon in a first section to polysilicon. The method further comprises patterning the amorphous silicon of a second section and the polysilicon of the first section using a same mask size and pattern. The patterning results in a first critical dimension of the amorphous silicon and a second critical dimension of the polysilicon.

In yet another aspect of the invention, a structure comprises a first dummy gate comprising amorphous silicon having a first critical dimension comprising an undercut under a hardmask material. The structure further comprises a second dummy gate comprising polysilicon having a second critical dimension which is devoid of the undercut under the hardmask material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures, which comprises the structures of the present invention. In still further embodiments, a method in a computer-aided design system is provided for generating a functional design model of the semiconductor structures. The method comprises generating a functional representation of the structural elements of the semiconductor structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to gate structures on a wafer with different gate lengths and a method of manufacture. More specifically, the present invention provides a non-lithographic method to achieve multiple gate lengths on a single wafer. In embodiments, the multiple gate lengths can be formed without altering, revising or reordering, in any way, a mask used in the lithography processes. Instead, advantageously, the multiple gate lengths can be formed through processing steps, e.g., etching steps, which eliminate the need for reordering of a new mask.

In more specific embodiments, the advantages of the present invention can be implemented in metal gate processes, e.g., gate-last process, in order to achieve different critical dimensions of gates (e.g., gate lengths) on a single wafer. This can be achieved by exploiting the difference in etch behavior between amorphous Si and poly-Si. That is, by modulating the crystalinity structure of the gate silicon (Si), it is now possible to modulate an undercut/lateral erosion of a dummy gate structure to provide different gate lengths, using the same etchant and etching processes. The modulation of the undercut/lateral erosion of the dummy gate structures can then be exploited for use with metal gates, e.g., to achieve different critical dimensions (e.g., gate lengths) of gates on a single wafer. This provides the following advantages:

(i) a critical dimension (CD) difference can now be achieved through the etching process, and not through lithography. This reduces the Optical Proximity Correction (OPC) mask complexity;

(ii) the critical dimension offset for wimpy devices can now be achieved through an etch process. In this way, there is no need to reorder the proximity correction (PC) mask, greatly reducing costs and fabrication times; and (iii) there is only a need for a block mask to provide wimpy enablement, which can be provided at a significantly lower cost than reordering of the mask.

Figure 1:
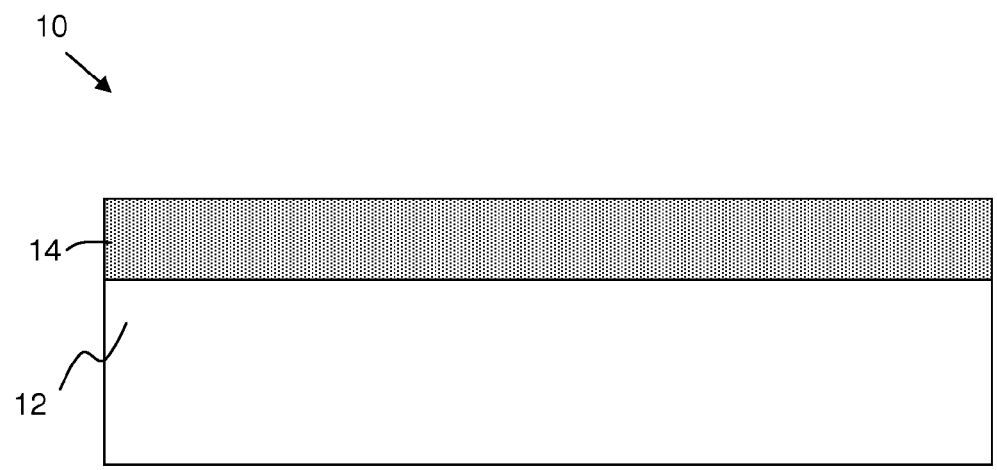
FIGS. 1-6 show structures and respective processing steps in accordance with aspects of the present invention.

FIG. 1 shows an intermediate structure and respective processing steps in accordance with aspects of the present invention. In particular, FIG. 1 shows a structure, generally represented as reference numeral 10. In embodiments, the structure 10 can be an NFET, PFET, a FINFet structure or other conventional replacement gate structure, for example. The structure 10 of the present invention can be formed using conventional deposition, lithography and etching processes, as should be understood by those of ordinary skill in the art.

In embodiments, the structure 10 comprises a substrate 12. The substrate 12 can be any substrate material, e.g., silicon. An amorphous silicon layer 14 is formed on the substrate 12 using, for example, conventional deposition methods, e.g., chemical vapor deposition (CVD). In embodiments, the amorphous silicon layer 14 can have, for example, a thickness of about 120 nm; although, other dimensions are also contemplated by the present invention.

Figure 2:
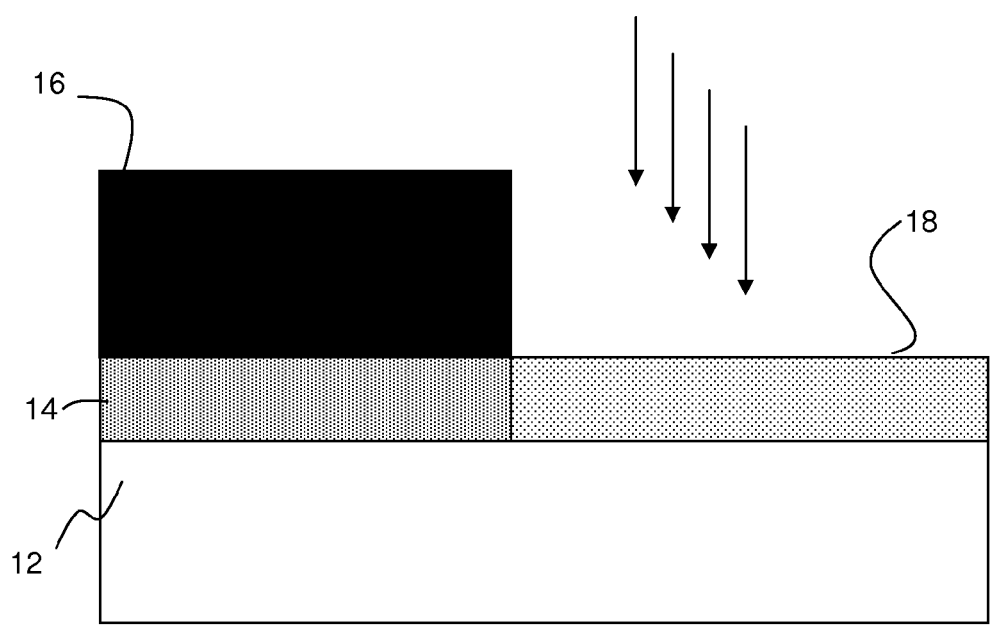

In FIG. 2, a mask 16 is formed over portions of the amorphous silicon layer 14. More specifically, a blocking mask 16, e.g., nitride, can be blanket deposited on the amorphous silicon layer 14 using a CVD process, and then subjected to a lithography and etching process, as known to those of skill in the art. The lithography and etching process will pattern the mask 16, such that portions of the amorphous silicon layer 14 remain blocked, while other portions remain exposed. In embodiments, the portions of the amorphous silicon layer 14 which are blocked will be used to form smaller critical dimension devices, as described herein.

Still referring to FIG. 2, the exposed portions of the amorphous silicon layer 14 are subjected to a fabrication process for rendering, for example, the amorphous silicon layer 14 into a polycrystalline silicon (poly-Si) layer 18. This can be accomplished in many different processes. For example, and by way of non-limiting illustration, the exposed amorphous silicon layer 14 is exposed to a particle flux (e.g. a plasma or a neutral beam). The resulting treatment causes an action that enhances a subsequent crystallization process. The particle flux treatment is followed by an anneal step that enables a rapid crystallization. By appropriate masking prior to the treatment, crystallization in non-treated areas (e.g., areas of the mask 16) is prevented while crystallization in treated areas (e.g., exposed portions) occurs during the anneal procedure. See, for example, U.S. Pat. No. 5, 624,873, the contents of which are incorporated by reference in their entirety herein.

Figure 3:
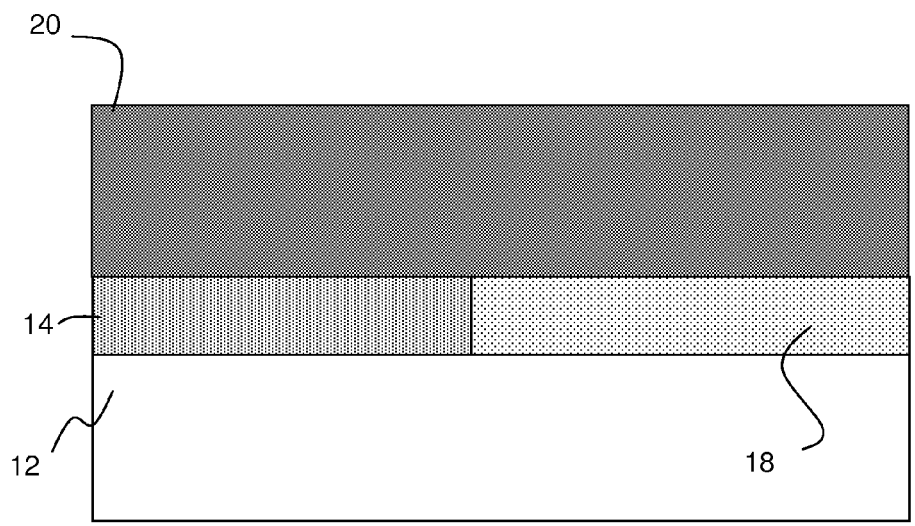

In FIG. 3, the mask 16 is stripped and a hardmask 20 is formed over the layers 16, 18. In embodiments, the hardmask 20 is SiN material which can be blanket deposited on the layers 16, 18. In embodiments, the blanket deposition is a CVD process.

Figure 4:
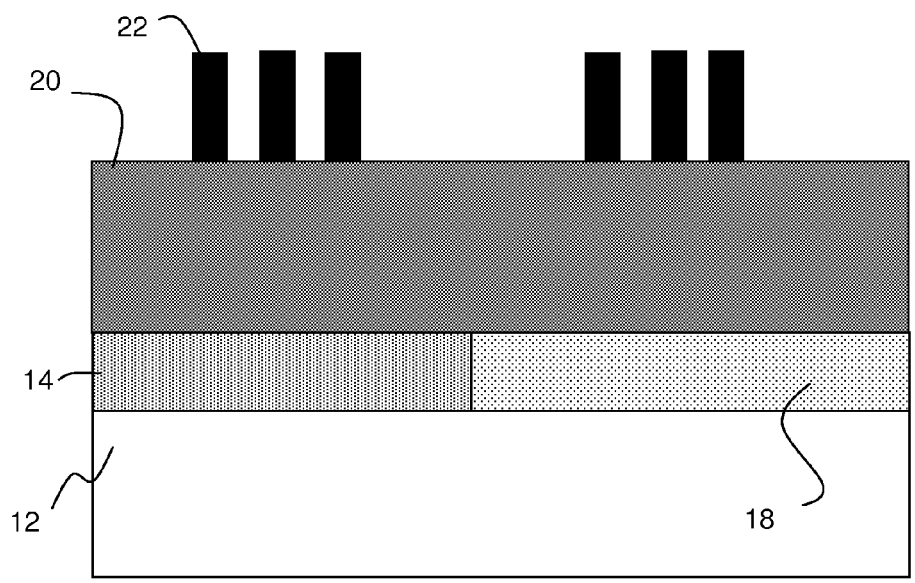

In FIG. 4, a resist pattern 22 is formed on the hardmask 20. In embodiments, the resist pattern 22 comprises a uniform pattern formed from a same pattern on a single lithography mask. In more specific embodiments, a resist material is formed on the hardmask 20, using conventional deposition processes. The resist material is then subjected to lithography and etching processes, as is well known to those of skill in the art, to form the resist pattern 22. As shown in FIG. 4, the resist pattern 22 is provided over both the layers 16, 18, with the pattern having uniform length.

Figure 5:
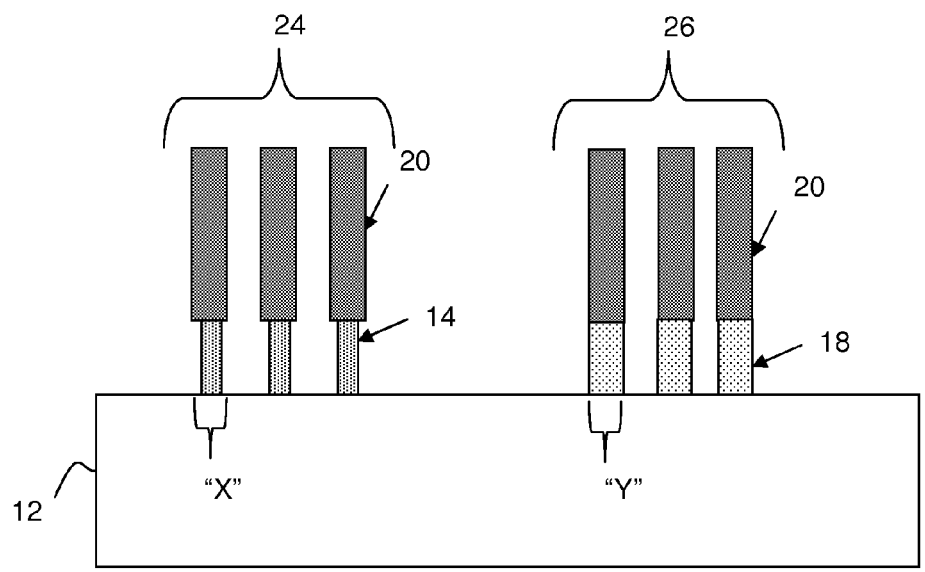

FIG. 5 is representative of a patterning step in accordance with aspects of the present invention. More specifically, the structure shown in FIG. 4 is subjected to an etching process to form dummy gates 24 and dummy gates 26 shown in FIG. 5. As should be understood by those of ordinary skill in the art, the dummy gates 24 and dummy gates 26 are formed in a single etching step which are subsequently removed in order to form replacement metal gates. In embodiments, the etching step can be a reactive ion etch, using a chemistry, for example, of HBr/O₂/He mixture.

As shown in FIG. 5, the etching process results in gates having different lengths. More specifically, the gates, generally represented at reference numeral 24, will have gate lengths that are smaller than the gate lengths of gates 26. That is, the gates 24 comprising the amorphous silicon layer 14 will have a smaller critical dimension than the gates 26 comprising the polysilicon layer 18, e.g., X<Y. This is due to the difference in the etch behavior between the amorphous Si and the polysilicon. That is, by modulating the crystalinity structure of the gate Si, the amorphous silicon layer 14 will result in a undercut/lateral erosion, thus providing a smaller critical dimension than the polysilicon layer 18, e.g., different gate lengths.

Figure 6:
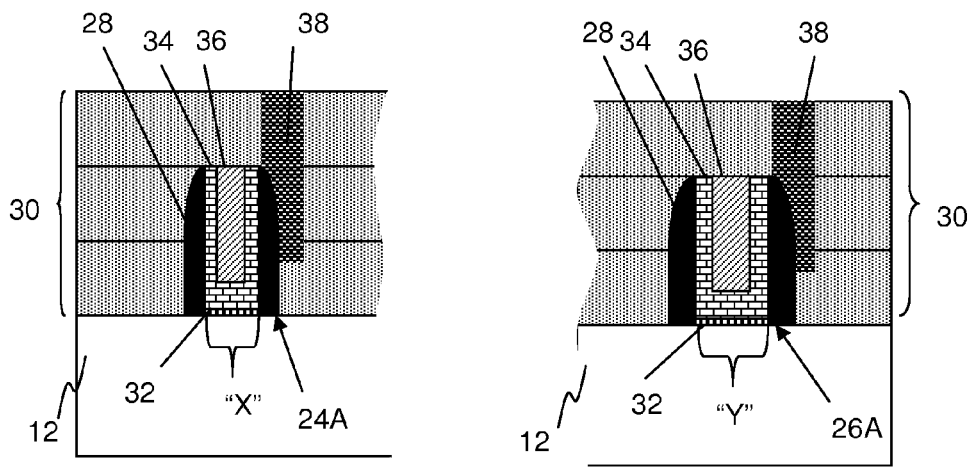

FIG. 6 shows an example of a semiconductor structure fabricated in accordance with aspects of the present invention. In FIG. 6, a first gate 24A and a second gate 26A are formed, with different gate lengths. The gate lengths "X" and "Y" correspond with that of FIG. 5, for the dummy gates 24, 26, respectively. In embodiments, the gates can be formed using known processes.

By way of one illustrative, non-limiting example, a spacer material is deposited on the gates 24, 26 to form a spacer 28. Source and drains can then formed by, for example, an epi growth, implantation and/or doping process. An interlevel dielectric material 30 can be deposited on the wafer (e.g., on the substrate 12). The interlevel dielectric material 30 can be, e.g., oxide, deposited using a CVD process. In embodiments, the dummy gate structures 24, 26 are then removed. A gate dielectric material 32 is formed on the substrate 12, within the trenches formed by the removal of the dummy gate structures. In embodiments, the gate dielectric material 32 is a high-k dielectric material such as, for example, a hafnium oxide or other hafnium based material. In embodiments, the gate dielectric material 32 can be deposited using a conventional CVD process. The thickness of the gate dielectric material 32 can vary depending on the required device performance.

A metal liner 34 is formed on the gate dielectric material 32 and spacers 28. In embodiments, the metal liner 30 is a workfunction metal which may be, for example, TiN or TaN; although other workfunction metals are also contemplated by the present invention depending on the engineering criteria and type of device, e.g., NFET, PFET, etc. A metal gate material 36 is formed on the metal material 34. Contacts 38 can then be formed in a conventional manner. The contacts can be, for example, Al or tungsten, formed in a borderless or self aligned process.

Figure 7:
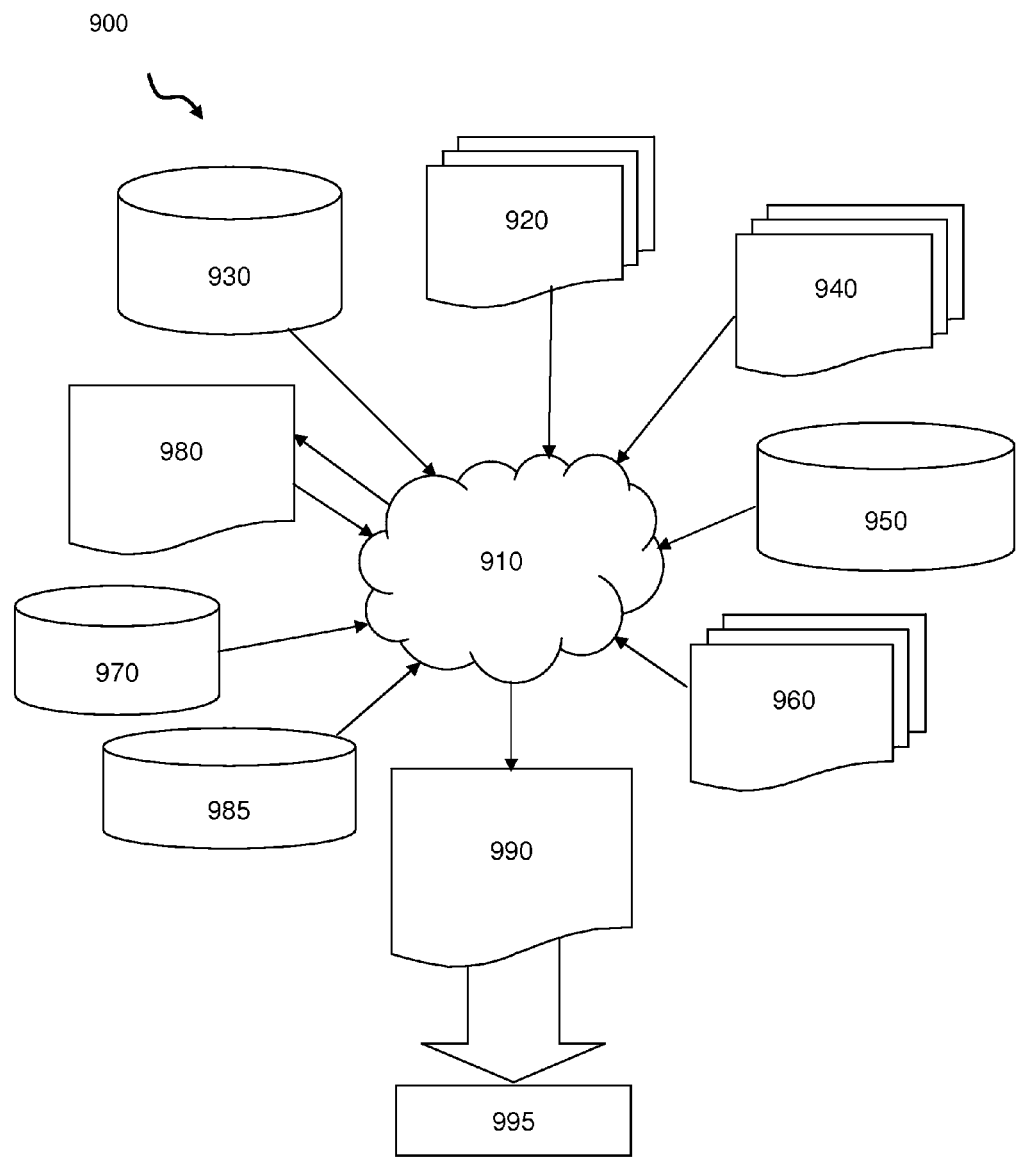
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a first gate structure with a first critical dimension, using a pattern of a mask; and
   forming a second gate structure with a second critical dimension, different than the first critical dimension of the first gate structure, using the pattern of the mask.

2. The method of claim 1, wherein the first gate structure comprises a first material and the second gate structure comprises a second material.

3. The method of claim 2, wherein the first material is amorphous silicon and the second material is polysilicon, which have different etch rates.

4. The method of claim 3, wherein the first critical dimension is smaller than the second critical dimension due to different etch rates of the first material and the second material.

5. The method of claim 4, wherein the first critical dimension and the second critical dimension are gate lengths.

6. The method of claim 1, wherein the forming of the first gate structure and the second gate structure comprise:
   forming a first material on a substrate;
   blocking a first section of the first material on the substrate with a blocking material;
   subjecting an unmasked portion of the first material of a second section to a fabrication process to convert the first material to a second material, which has a different etch rate than the first material;
   forming a hardmask over the first material and the second material; and
   patterning the hardmask and underlying first material and second material, by subjecting the hardmask, the first material and the second material to a same etching process.

7. The method of claim 6, wherein the first material forms an undercut or lateral erosion under the patterned hardmask, wherein the undercut has the first critical dimension smaller than the second critical dimension.

8. The method of claim 7, further comprising replacing the first gate structure and the second gate structure with metal gate material, such that the metal gate material forms a first metal gate with the first critical dimension and a second metal gate with the second critical dimension.

9. The method of claim 7, wherein the pattern of the hardmask is a same over the first material and the second material.

10. The method of claim 9, wherein the first material is amorphous silicon and the second material is polysilicon.

11. A method, comprising:
    forming amorphous silicon on a substrate;
    converting an unmasked portion of the amorphous silicon in a first section to polysilicon; and
    patterning the amorphous silicon of a second section and the polysilicon of the first section using a same mask size and pattern, wherein the patterning results in a first critical dimension of the amorphous silicon and a second critical dimension of the polysilicon, wherein the patterning comprises:
    forming a hardmask over the amorphous silicon and the polysilicon;
    forming a resist pattern on the hardmask to form a uniform pattern; and
    etching the hardmask, the amorphous silicon and the polysilicon using a same etchant and same pattern of a mask to form a first gate structure with the first critical dimension and a second gate structure with the second critical dimension.

12. The method of claim 11, wherein the first critical dimension is smaller than the second critical dimension.

13. The method of claim 11, wherein the patterning forms a first gate structure comprising the amorphous silicon and a second gate structure comprising the polysilicon.

14. The method of claim 13, wherein the amorphous silicon and the polyilicon have different etch rates.

15. The method of claim 14, wherein:
    the first critical dimension is smaller than the second critical dimension due to different etch rates of the amorphous silicon and the polysilicon; and
    the first critical dimension and the second critical dimension are gate lengths.

16. A method, comprising:
    forming amorphous silicon on a substrate;
    converting an unmasked portion of the amorphous silicon in a first section to polysilicon; and
    patterning the amorphous silicon of a second section and the polysilicon of the first section using a same mask size and pattern, wherein the patterning results in a first critical dimension of the amorphous silicon and a second critical dimension of the polysilicon,
    wherein the first critical dimension includes an undercut or lateral erosion under an overlying hardmask that was patterned with the amorphous silicon of the second section.

17. The method of claim 11, wherein the first gate structure comprises the hardmask and the amorphous silicon with an undercut or lateral erosion and the second gate structure comprises the hardmask and the polysilicon, which is devoid of the undercut or lateral erosion.

18. The method of claim 17, further comprising replacing the first gate structure and the second gate structure with metal gate material, such that the metal gate material forms a first metal gate with the first critical dimension and a second metal gate with the second critical dimension.

* * * * *